United States Patent [19]
Anthony et al.

[11] Patent Number: 5,464,665
[45] Date of Patent: Nov. 7, 1995

[54] MICROWAVE RF, OR AC/DC DISCHARGE ASSISTED FLAME DEPOSITION OF CVD DIAMOND

[75] Inventors: Thomas R. Anthony, Schenectady; James F. Fleischer, Scotia, both of N.Y.

[73] Assignee: General Electric Company, Worthington, Ohio

[21] Appl. No.: 74,197

[22] Filed: Jun. 9, 1993

Related U.S. Application Data

[63] Continuation of Ser. No. 782,681, Oct. 25, 1991, abandoned.

[51] Int. Cl.$^6$ ................................. B05D 3/06; B01J 3/06
[52] U.S. Cl. ...................... 427/570; 427/450; 427/575; 427/577; 427/122; 427/249; 423/446
[58] Field of Search ................... 427/446, 447, 427/450, 573, 570, 575, 577, 122, 249; 423/446

[56] References Cited

U.S. PATENT DOCUMENTS

| | | | |
|---|---|---|---|
| 3,677,799 | 7/1972 | Hou | 427/580 |
| 4,212,933 | 7/1980 | Markin et al. | 427/577 |
| 4,434,188 | 2/1984 | Kamo et al. | 427/121 |
| 4,673,589 | 6/1987 | Standley | 427/577 |
| 4,740,263 | 4/1988 | Imai et al. | 427/42 |
| 4,749,587 | 6/1988 | Bermann et al. | 427/37 |
| 4,767,608 | 8/1988 | Matsumoto et al. | 427/39 |
| 4,824,690 | 4/1989 | Heinecke et al. | 427/577 |
| 4,830,702 | 5/1989 | Singh et al. | 427/39 |
| 4,859,490 | 8/1989 | Ikegaya et al. | 427/577 |
| 4,938,940 | 7/1990 | Hirose et al. | 427/34 |
| 5,039,548 | 8/1991 | Hirose et al. | 427/45.1 |
| 5,087,434 | 2/1992 | Frenklack et al. | 427/577 |
| 5,215,788 | 6/1993 | Murayam et al. | 423/446 |
| 5,217,700 | 6/1993 | Kurihara et al. | 423/446 |

FOREIGN PATENT DOCUMENTS

| | | |
|---|---|---|
| 0272418 | 6/1988 | European Pat. Off. . |
| 0288065 | 10/1988 | European Pat. Off. . |
| 0286310 | 10/1988 | European Pat. Off. . |

OTHER PUBLICATIONS

*Webster's Ninth New Collegiate Dictionary*, p. 971 Merriam–Webster, Inc., Springfield, Mass., U.S.A. 1990 (no month).

*Primary Examiner*—Marianne Padgett

[57] ABSTRACT

Broadly, the present invention is directed to improving a chemical vapor phase deposition (CVD) method for synthesis of diamond wherein a hydrocarbon/hydrogen gaseous mixture is subjected to a combustion flame in the presence of oxygen to at least partially decompose the gaseous mixture to form CVD diamond. The improvement in process comprises subjecting said combustion flame to one or more of dielectric heating, d.c. discharge, or a.c. discharge. Dielectric heating can be accomplished by subjecting the combustion flame to microwave (MW) frequency discharge or radiofrequency (RF) discharge. By superimposing dielectric heating or d.c./a.c. discharge plasma generation on combustion flame process, the carbon utilization rate of the combustion flame process should improve substantially. As noted above, given the low carbon utilization rate for combustion flame techniques already, small percentage improvements in the carbon utilization rates translate into substantial cost savings in generation of CVD diamond by such combustion flame technique.

4 Claims, 2 Drawing Sheets

MICROWAVE RF, OR AC/DC DISCHARGE ASSISTED FLAME DEPOSITION OF CVD DIAMOND

This is a continuation of application Ser. No. 07/782,681 filed on Oct. 25, 1991 now abandoned.

BACKGROUND OF THE INVENTION

The present invention relates to the chemical vapor deposition (CVD) production of diamond by combustion flame techniques and more particularly to improving the carbon utilization rates of such techniques.

Its hardness and thermal properties are but two of the characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermally stable carbon phase, a variety of additional products found favor in the marketplace. Polycrystalline diamond compacts, often supported on a tungsten carbide supports in cylindrical or annular form, extended the product line for diamond additionally. However, the requirement of high pressure and high temperature has been a limitation in product configuration, for example.

Recently, industrial effort directed toward the growth of diamond at low pressures, where it is metastable, has increased dramatically. Although the ability to produce diamond by low-pressure synthesis techniques has been known for decades, drawbacks including extremely low growth rates prevented wide commercial acceptance. Recent developments have led to higher growth rates, thus spurring recent industrial interest in the field. Additionally, the discovery of an entirely new class of solids, known as "diamond like" carbons and hydrocarbons (DLC films), is an outgrowth of such recent work. Details on CVD processes additionally can be reviewed by reference to Angus, et at., "Low-Pressure, Metastable Growth of Diamond and 'Diamondlike' Phases", *Science*, vol. 241, pages 913–921 (Aug. 19, 1988); and Bachmann, et al., "Diamond Thin Films", *Chemical and Engineering News*, pages 24–39 (May 15, 1989).

Low pressure growth of diamond has been dubbed "chemical vapor deposition" or "CVD" in the field. Two predominant CVD techniques have found favor in the literature. One of these techniques involves the use of a dilute mixture of hydrocarbon gas (typically methane) and hydrogen wherein the hydrocarbon content usually is varied from about 0.1% to 2.5% of the total volumetric flow. The gas is introduced via a quartz tube located just above a hot tungsten filament which is electrically heated to a temperature ranging from between about 1,750° to 2,400° C. The gas mixture disassociates at the filament surface and diamonds are condensed onto a heated substrate placed just below the hot tungsten filament. The substrate is held in a resistance heated boat (often molybdenum) and heated to a temperature in the region of about 500° to 1,100° C.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

A third technique not favored in the literature involves the generation of a combustion flame from the hydrocarbon/hydrogen gaseous mixture in the presence of oxygen. A drawback to this technique is the very low (0.01%) carbon utilization rate. However, because this rate is so low, a small absolute improvement (e.g. even 1%) in carbon utilization rate could reduce the operation cost and capital cost of the combustion flame process by two orders of magnitude so that such a modified combustion flame process could economically compete with, for example, the hot filament process which has a carbon utilization rate of about 30%.

Broad Statement of the Invention

Broadly, the present invention is directed to improving a chemical vapor phase deposition (CVD) method for synthesis of diamond wherein a hydrocarbon/hydrogen gaseous mixture is subjected to a combustion flame in the presence of oxygen to at least partially decompose the gaseous mixture to form CVD diamond. The improvement in process comprises subjecting said combustion flame to one or more of dielectric heating, d.c. discharge, or a.c. discharge. Dielectric heating can be accomplished by subjecting the combustion flame to microwave (MW) frequency discharge or radiofrequency (RF) discharge. By superimposing dielectric heating or d.c./a.c. discharge plasma generation on combustion flame process, the carbon utilization rate of the combustion flame process should improve substantially. As noted above, given the low carbon utilization rate for combustion flame techniques already, small percentage improvements in the carbon utilization rates translate into substantial cost savings in generation of CVD diamond by such combustion flame technique.

The drawings will be described in detail in connection with the following description.

DETAILED DESCRIPTION OF THE INVENTION

Since an ionized plasma exists at the flame front of a combustion flame, electric fields can couple with and feed energy into this plasma. Such electric fields can be generated by microwave, RF or d.c. electrical sources. By assisting the flame process with such energy sources, more hydrogen and hydrocarbons can be added to the gas feedstock of the combustion flame without reducing the flame temperature. If only 1–2% extra hydrocarbon can be added and convened to diamond, the diamond utilization rate of the combustion flame process can be increased by several orders of magnitude.

Representative combustion flame techniques for the vapor phase synthesis of diamond can be found in U.S. Pat. Nos. 4,938,940 and 4,981,671, the disclosures of which are expressly incorporated herein by reference. As those skilled in the art are well aware, a hydrocarbon/hydrogen gaseous mixture is subjected to a combustion flame in the presence of controlled amounts of oxygen in order to at least partially disassociate the gaseous mixture in order to grow/deposit diamond on a substrate held at a CVD diamond-forming temperature ranging from about 500°–1100° C. The carbon utilization rate for such a combustion flame process, however, is quite low, as stated above.

Figure 1:
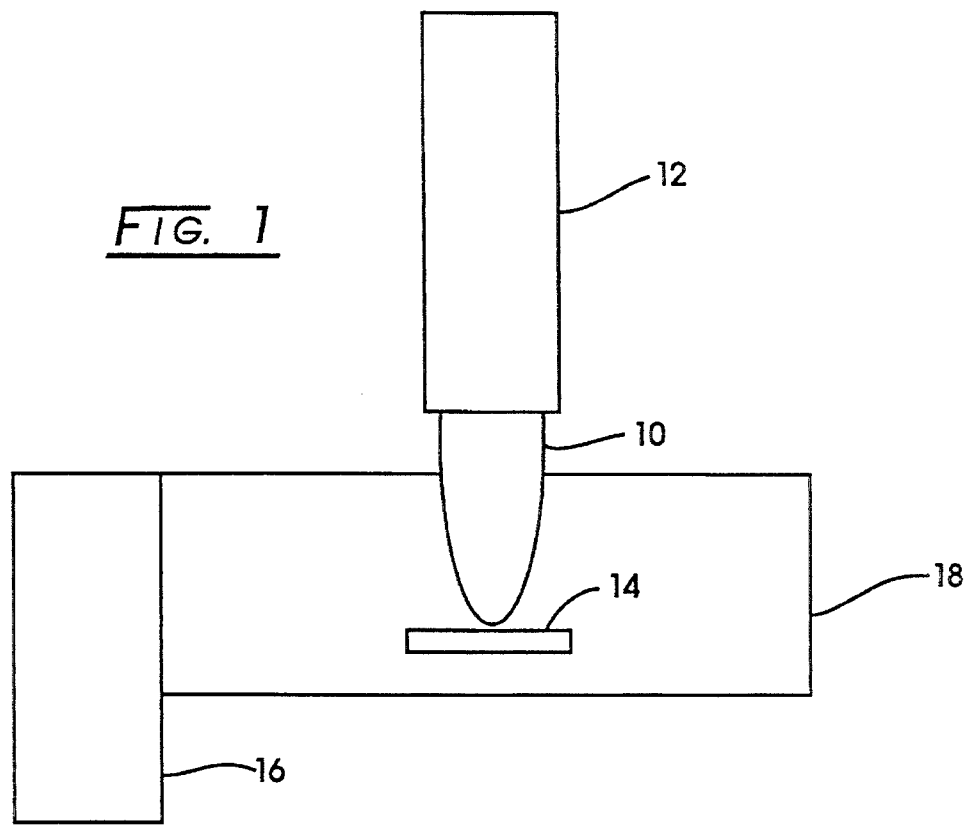
FIG. 1 is a simplified schematic representation of a combustion flame generating CVD diamond on a substrate wherein dielectric heating is accomplished by a microwave generator and wave guide assembly.

In order to enhance the carbon utilization rate in the combustion flame process, dielectric heating or electrical discharge assistance is practiced. Referring to FIG. 1, it will be observed that combustion flame 10 is generated from torch 12 for growing/depositing CVD diamond on substrate 14. Microwave generator 16 is composed of a microwave transmitter and suitable antenna for generating frequencies in the microwave range. Suitably shaped, wave guide 18 propagates the microwave frequency electromagnetic waves along its length in conventional fashion. The waves intersect and interact with combustion flame 10 for improving the carbon utilization rate.

Figure 2:
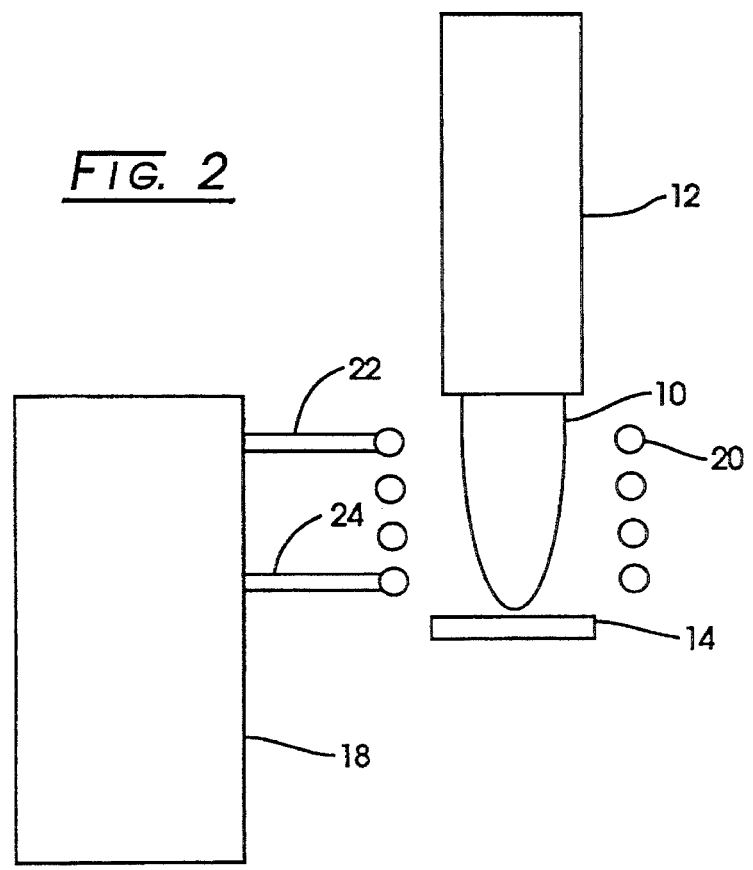
FIG. 2 is a simplified schematic representation like that of FIG. 1 depicting radiofrequency coils (an antenna) assisted flame deposition.
Figure 3:
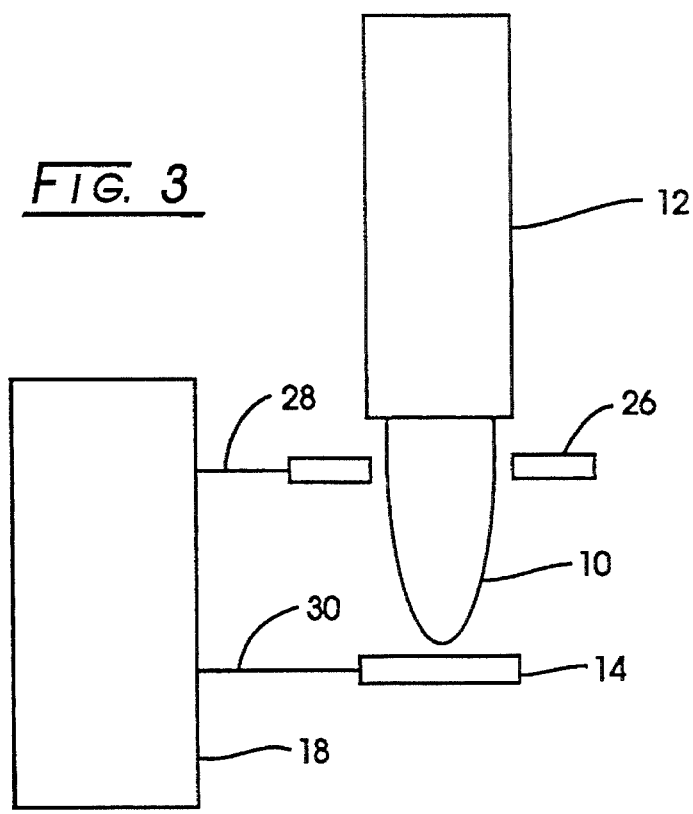
FIG. 3 is a simplified schematic representation as in FIG. 1 showing an annular antenna for broadcasting the RF frequency discharge onto the combustion flame.

Referring to FIG. 2, it will be observed that transmitter 18 generates in the RF range and is connected to coils 20 which serve as an antenna which, in turn, are in electrical communication with transmitter 18 via lines 22 and 24. Again, RF frequency waves are superimposed onto combustion flame 10 for improving the carbon utilization rate. FIG. 3 is an alternative embodiment for the RF generator wherein annular antenna 26 is connected by line 28 to transmitter 18 with substrate 14 connected to transmitter 18 by line 30.

Figure 4A:
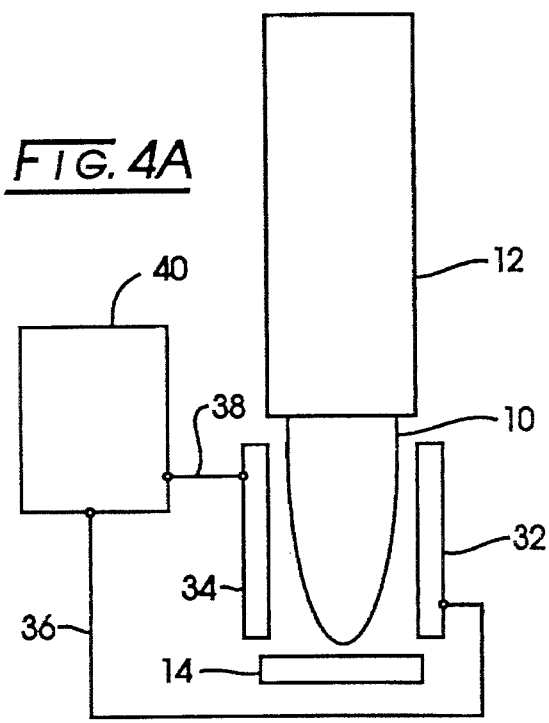
FIGS. 4A and 4B are simplified schematic representations like FIG. 1 depicting alternative a.c. and d.c. discharge configurations for assisting the flame combustion deposition of CVD diamond.
Figure 4B:
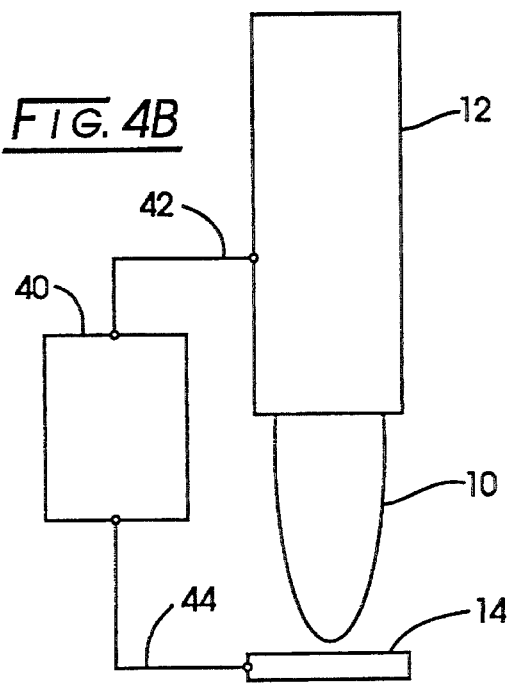

Finally, FIGS. 4A and 4B show two configurations for electrical discharge assisted flame combustion. With reference to FIG. 4A, electrodes 32 and 34 are connected, respectively, by lines 36 and 38 to power supply 40. In FIG. 4B, torch 12 is connected via line 42 to power supply 40 and substrate 14 is connected via line 44 to power supply 40.

It will be appreciated that the assisting techniques described in the drawings all have been used independently for the generation of plasma for growing/depositing CVD diamond. They have not, however, been used to amplify or assist a combustion flame for improving the carbon utilization rate of the combustion flame in the deposition/growth of CVD diamond.

Transmitter 16 or 18 can be a triode oscillator for generating in the RF range which typically is from 2 to 200 MHz for heating, or a magnetron or klystron for generating in the microwave range which typically is from about 300 to 30,000 MHz for heating. Frequencies from about 915 to 2450 MHz commonly are used for heating purposes. Further information on d.c. discharge or radio frequency electromagnetic radiation to generate a plasma can be found in U.S. Pat. Nos. 4,749,587, 4,767,608, and 4,830,702; and U.S. Pat. No. 4,434,188 with respect to use of microwaves. The substrate may be bombarded with electrons during the CVD decomposition process in accordance with U.S. Pat. No. 4,740,263.

We claim:

1. In a chemical vapor deposition (CVD) method for the synthesis of diamond wherein a hydrocarbon/hydrogen gaseous mixture is subjected to a combustion flame in the presence of oxygen to at least partially decompose said gaseous mixture to form CVD diamond on the surface of substrate, the improvement which comprises:

subjecting said combustion flame to dielectric heating comprising radio frequency discharge comprising an antenna adapted to surround said combustion flame, and said antenna and said substrate are connected to a transmitter for superimposing radio frequency waves on said flame, whereby said method has a carbon utilization rate of at least 1%.

2. The CVD method of claim 1 wherein said CVD diamond is formed on a substrate held at a CVD diamond-forming temperature, wherein said temperature is from about 500° C.–1100° C.

3. The CVD method according to claim 1 wherein said antenna comprises a coil.

4. The CVD method according to claim 1 wherein said antenna has an annular shape.

* * * * *